United States Patent
Arghavani et al.

(10) Patent No.: US 7,678,662 B2
(45) Date of Patent: Mar. 16, 2010

(54) MEMORY CELL HAVING STRESSED LAYERS

(75) Inventors: Reza Arghavani, Scotts Valley, CA (US); Ellie Yieh, San Jose, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 218 days.

(21) Appl. No.: 11/609,851

(22) Filed: Dec. 12, 2006

(65) Prior Publication Data

US 2007/0132054 A1    Jun. 14, 2007

Related U.S. Application Data

(60) Provisional application No. 60/750,162, filed on Dec. 13, 2005.

(51) Int. Cl.
  *H01L 21/76* (2006.01)
(52) U.S. Cl. .................. 438/424; 438/257
(58) Field of Classification Search .......... 438/424, 438/257
  See application file for complete search history.

(56) References Cited

U.S. PATENT DOCUMENTS

| | | | |
|---|---|---|---|
| 4,471,471 A | 9/1984 | DiMaria et al. | |
| 6,580,640 B2 | 6/2003 | Kao | |
| 6,642,106 B1 | 11/2003 | Yang et al. | |
| 6,937,521 B2 | 8/2005 | Avni et al. | |
| 2003/0181005 A1 | 9/2003 | Hachimine et al. | |
| 2004/0113174 A1 | 6/2004 | Chidambarrao et al. | |
| 2005/0199945 A1 | 9/2005 | Kodama et al. | |
| 2005/0255667 A1 | 11/2005 | Arghavani et al. | |
| 2006/0105106 A1 | 5/2006 | Balseanu et al. | |

OTHER PUBLICATIONS

Zhao et al. "Opposing Dependence of the Electron and Hole Gate Currents in SOI MOSFETs Under Uniaxial Strain", IEEE vol. 26, No. 6 Jun. 2005.
Al-Bayati et al. "Production Processes for Inducing Strain in CMOS Channels", Semiconductor Fabtech, 26th Edition, London, UK: Bernard Henry, Trans-World, Aug 2005.

(Continued)

*Primary Examiner*—Long Pham
(74) *Attorney, Agent, or Firm*—Pillsbury Winthrop Shaw Pittman

(57) ABSTRACT

A memory cell comprises a p-doped substrate with a pair of spaced apart n-doped regions on the substrate that form a source and drain about the channel. A stack of layers on the channel comprises, in sequence, (i) a tunnel oxide layer, (ii) a floating gate, (iii) an inter-gate dielectric, and (iv) a control gate. A polysilicon layer is on the source and drain. A cover layer covering the stack of layers comprises a spacer layer and a pre-metal-deposition layer. Optionally, contacts are used to contact each of the source, drain, and silicide layers, and each have exposed portions. A shallow isolation trench is provided about n-doped regions, the trench comprising a stressed silicon oxide layer having a tensile stress of at least about 200 MPa. The stressed layer reduces leakage of charge held in the floating gate during operation of the memory cell.

6 Claims, 2 Drawing Sheets

OTHER PUBLICATIONS

X. Yang at al., "Strain-Induced Changes in the Gate Tunneling Currents in p-Channel MOSFETs." (Submitted to IEEE Electron Device Letters).

Arghavani et al. "Strain Engineering in Non-Volatile Memories," Semiconductor International, Apr. 2006.

Arghavani et al. "Strain Engineering to Improve Data Retention Time in Non-Volatile Memory" IEEE vol. 54, Issue 2, 2007.

Arghavani et al "Extending the Scalability of Non-Volatile Memory Cell Via Strain Engineering" (Submitted to IEEE Electron Device Letters).

International Search Report issued Jun. 19, 2007 in corresponding PCT/US2006/047831.

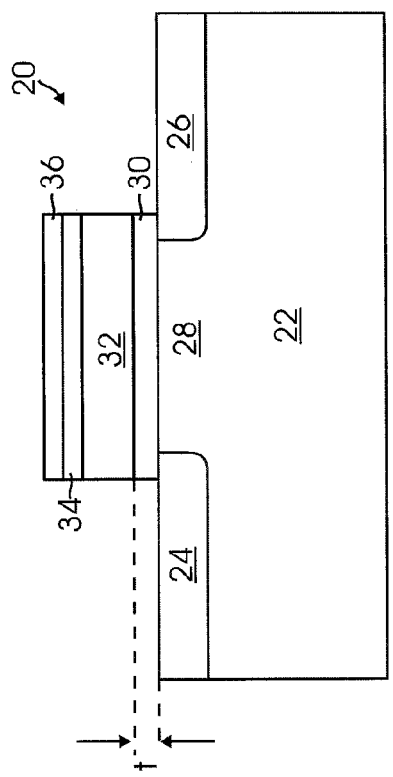
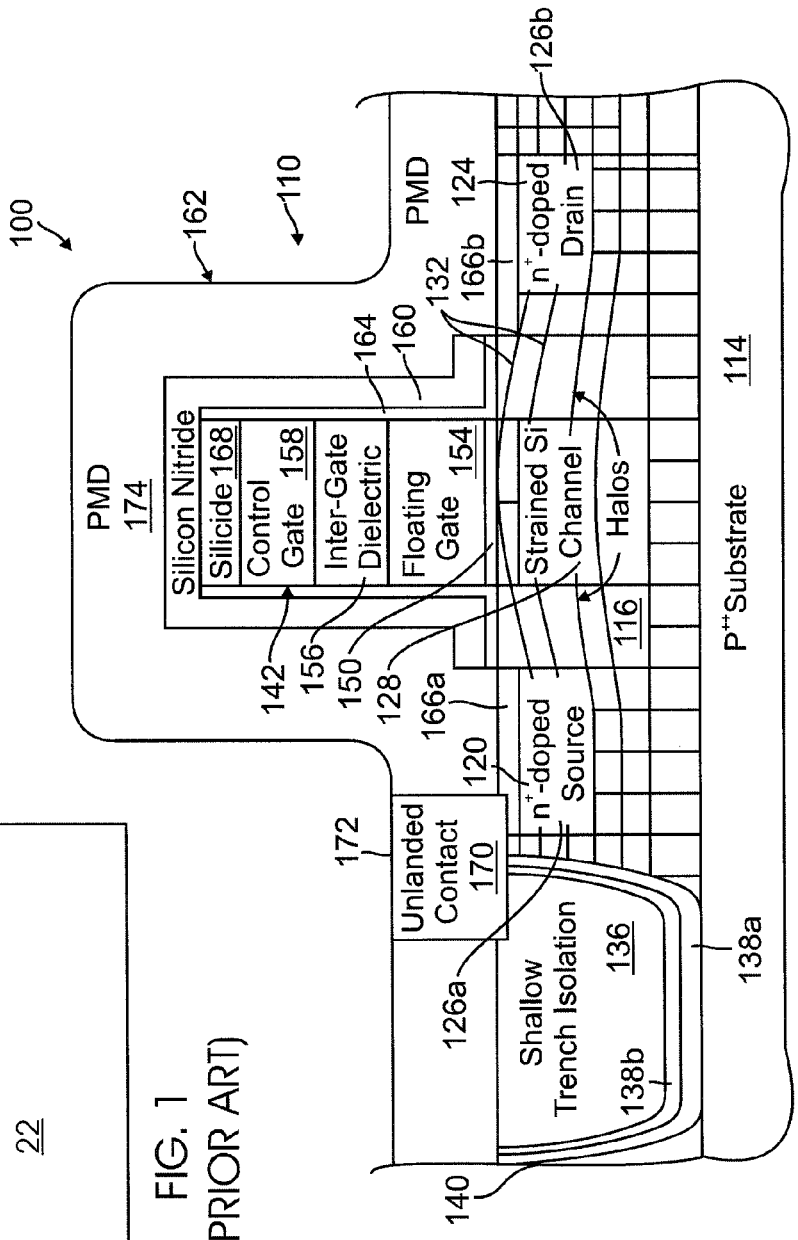
FIG. 1 (PRIOR ART)
FIG. 2

MEMORY CELL HAVING STRESSED LAYERS

CROSS-REFERENCE

The present application claims priority from U.S. Provisional Application No. 60/750,162 filed on Dec. 13, 2005, which is incorporated by reference herein and in its entirety.

BACKGROUND

Memory devices are used for internal or external storage in electronic components including, but not limited to, computers, digital cameras, cell phones, MP3 players, personal digital assistants (PDAs), video game consoles, and other devices. There are several different types of memory devices, including volatile and non-volatile memory. Volatile memory devices require a steady flow of electricity to maintain their contents, such as for example, random access memory (RAM). Non-volatile memory devices retain or store information even when electrical power to the electronic component is terminated. For example, read-only memory (ROM) can hold instructions for operating an electronic device. EEPROM (electrically erasable programmable read-only memory) is a type of non-volatile read-only memory (ROM) that can be erased by exposing it to an electrical charge. EEPROM typically comprise a number of memory cells that each have an electrically isolated floating gate to store charge which is transported to, or removed from, the floating gate by programming or erase operations.

One type of EEPROM is a memory cell that has a floating gate field-effect transistor capable of holding a charge, such as a flash memory cell. The flash memory cell provides both the speed of volatile memory, such as RAM, and the data retention qualities of non-volatile ROM. Advantageously, an array of memory cells can also be electrically erased or reprogrammed using a single electrical current pulse instead of one cell at a time. A typical memory array includes a large number of memory cells grouped into an erasable block. Each of the memory cells can be electrically programmed basis by charging the floating gate and the stored charge can be removed from the floating gate by an erase operation. Thus, the data in a memory cell is determined by the presence or absence of the charge in the floating gate.

An exemplary memory cell 20 comprises a substrate 22 comprising a source 24 and a drain 26, and channel 28 therebetween, as shown in FIG. 1. A tunnel oxide layer 30 allows electrons traveling between the source 24 and drain 26 to move to a floating gate 32 which holds charge. An inter-gate dielectric 34 lies above the floating gate 32 and a control gate 36 is over the inter-gate dielectric 34. The substrate 22 typically comprises a p-doped silicon wafer, and a source 24 and drain 26 which are both n-doped regions. The floating gate 32 and control gate 36 are typically made from polysilicon, and the inter-gate dielectric 34 is made from a silicon oxide/silicon nitride/silicon oxide layer commonly referred to as an O/N/O gate.

Flash memory cells 20 with higher memory densities are being developed to increase data storage capacity and reduce manufacturing costs. The memory density and data storage capacity of a memory cell 20 can be increased by reducing the minimum feature size of the cell. As the sizes of the features of the memory cell are reduced to ever-smaller levels of less than 90 nm, the thickness "t" of the tunnel oxide layer 30 is also correspondingly reduced. The thinner tunnel oxide layer 30 allows lower operational voltages to be used to induce electron movement from the channel 28 through the tunnel oxide layer 30 and to the floating gate 32. The lower the operational voltages used to program the memory cell 20, the lower the energy consumption of the cell 20, which is desirable.

However, while a memory cell 20 having smaller features can provide increased data storage capacity and reduced energy consumption, the data retention time of the cell 20 often undesirably decreases as the tunnel oxide layer 30 becomes thinner. The data retention time is the time duration for which the programmed charge remains in the floating gate 32 of the cell 20 without dissipation. Typically, electrons in the floating gate 32 gradually tunnel back across the tunnel oxide layer 30 over a period of time. The leakage current of the cell 20 is a current that occurs from electrons traversing the tunnel oxide layer 30 during a storage cycle or idle period of a programmed cell 20. The leakage current eventually results in total discharge of the charge stored in the cell 20 resulting in the loss of the data or information stored in the cell 20. The higher leakage current and increased charge tunneling occurring in the thinner tunnel oxide layer 30 reduces the charge retention time in the floating gate. Reduction in thickness of the tunnel oxide layer 30 also degrades the quality of the tunnel oxide thereby further increasing the flow of leakage current. Also, the properties of the tunnel oxide layer 30 generally degrade over time as it is subjected to consecutive charging and erase cycles.

While higher memory density and reduced energy consumption are desirable, it is also desirable to increase the data retention time of the memory cell 20. For example, various methods of operating memory cells 20 have been developed to reduce the leakage current through the tunnel oxide layer 30 while still minimizing its thickness. For example, U.S. Pat. No. 6,580,640 to Kao, which is incorporated herein by reference in its entirety, discloses a method of operating a memory cell 20 in which a positive charge is placed on a control gate 36 of the cell 20 to improve data retention of the electrons placed on the floating gate 32 of the cell 20. The positive charge causes the electrons on the floating gate 32 to migrate away from the tunnel oxide layer 30 of the cell 20 thereby reducing leakage currents. While this is an acceptable method of operation, it requires additional electrical power to place the positive charge, thereby increasing the power consumption of the cell 20.

Thus it is desirable to increase the memory density and storage capacity of a memory cell while still providing acceptable data retention times. It is also desirable to minimize the size of the features of the cell without excessive leakage current. Memory cells that use less energy are also more desirable for power saving applications.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 1 (Prior Art) is a cross-sectional side view of an embodiment of a memory cell comprising a flash memory configuration;

FIG. 2 is a cross-sectional side view of an embodiment of a memory cell comprising stressed layers to induce a strain in adjacent substrate layers.

DESCRIPTION

Figure 3:
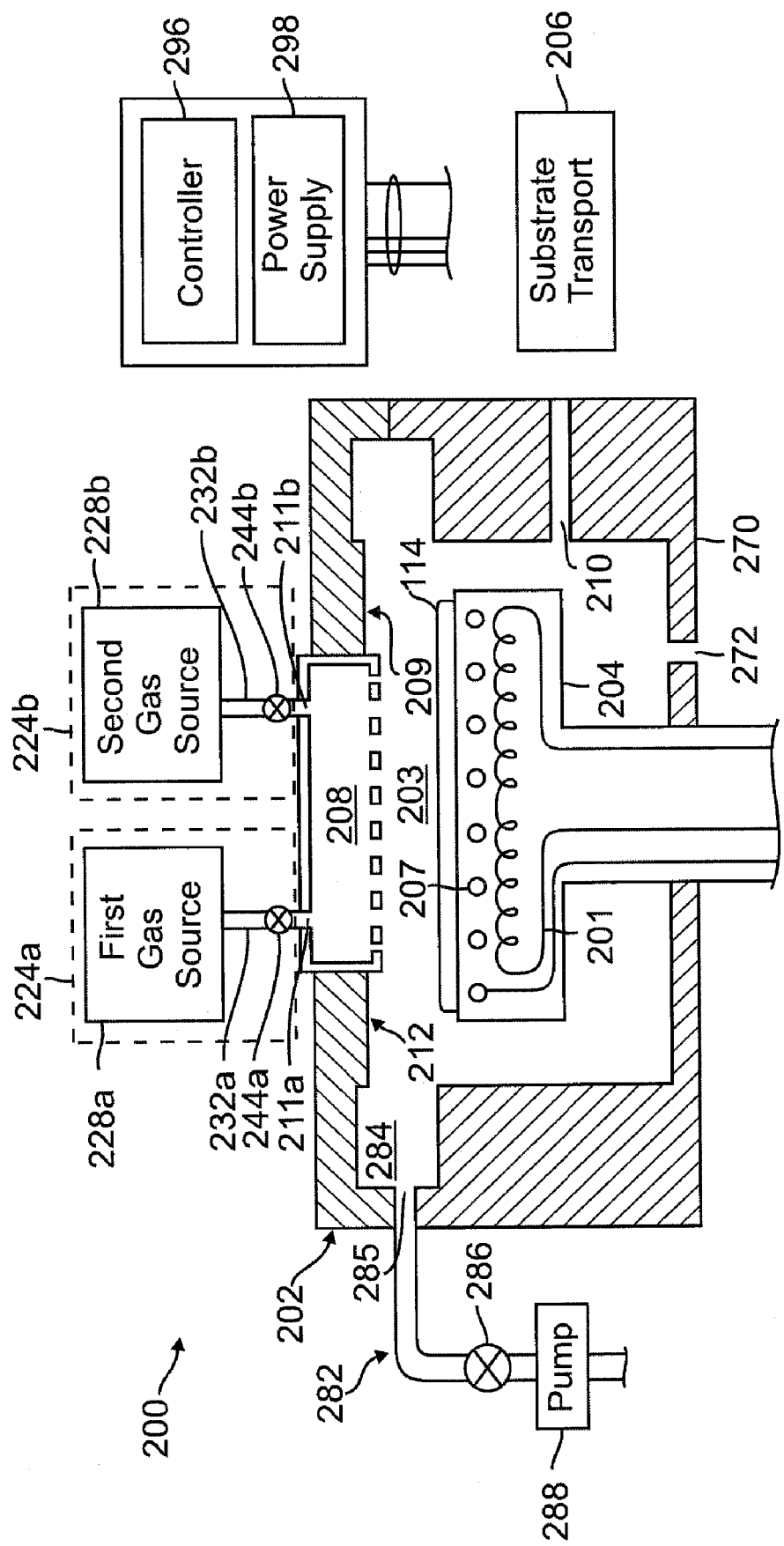
FIG. 3 is sectional side view of an embodiment of a deposition chamber suitable for forming a stressed layer on the substrate.

An exemplary embodiment of a memory device 100 comprising a substrate with overlying stress-inducing layers is shown in FIG. 2. The present invention is illustrated with reference to a memory device 100 comprising an embodiment of a memory cell 110 having a flash memory configuration; however, the present invention can also be used with other types of memory devices that can store information as would be apparent to those of the ordinary skill in the art, such as RAM, SRAM or DRAM configurations; thus, the present invention should not be limited to the illustrative embodiments shown and described. Also, the flash memory configuration can be other configurations, including but not limited to those shown herein, such as configurations having triple wells. Furthermore, it should be noted that the various layers and configurations described herein can be formed on the substrate in any order, and the process of fabricating the structure should not be limited to the order in which the structure is described, which is selected merely for convenience.

Generally, the memory cell 110 comprises a p-doped substrate 114 comprising p-doped silicon or other semiconductor materials such as germanium, silicon germanium, gallium arsenide, or combinations thereof. In one version, the substrate 114 comprises a $P^{++}$ silicon wafer having an overlying $P^-$ epitaxial layer 116. The $P^{++}$ silicon wafer comprises a p-type element such as a Group IIIA element, for example, boron, doped into silicon in a concentration of, for example, from about $1 \times 10^{19}$ to about $1 \times 10^{20}$ atoms/cm$^3$. An overlying $P^-$ epitaxial layer 116 comprises a lower concentration of p-type doping atoms, for example, from about $1 \times 10^{16}$ to about $1 \times 10^{17}$ atoms/cm$^3$. The flash memory cell configuration is essentially built on the $P^-$ epitaxial layer 116.

One or more shallow isolation trenches 136 are formed on the substrate to isolate arrays of memory cells 20 which are to be fabricated on the substrate 114. The shallow trench 136 is formed by a conventional lithographic etch process, for example, by depositing a mask comprising layers of silicon oxide and nitride, patterning the mask layers, and etching the exposed portions of the substrate between the mask features. One or more trench liner layers 138a,b can also be formed on the walls 140 of the isolation trench 136. For example, a first layer 138a can be silicon oxide and a second layer 138b can be silicon nitride. The trench liner layers 138b of silicon nitride can be formed by heating the substrate in an environment comprising an oxygen-containing gas and an oxynitride-containing gas, which also serves to round any undesirably sharp corners of the trench. The shallow trench 136 is filled with a dielectric, such as silicon oxide, which serves to electrically isolate the memory cells 110 from other active devices on the substrate. While this trench is described as an initial processing step, is should be noted that the shallow trench 136 can be formed at subsequent processing steps.

In one version of the present invention, the silicon oxide deposited in the shallow trench 136 is stressed to induce a tensile strain on memory cell layers as shown schematically by the strain lines 132 in FIG. 2. The silicon oxide is deposited under process conditions to form a stressed silicon oxide and the level of stress of the stressed layer is selected to provide the desired magnitude of stress in the surrounding layers. For example, the stressed layer can be stressed sufficiently high to introduce at least about 0.5 GPa or even about 1 GPa of stress into the channel layer 128. The stressed silicon oxide exerts a tensile stress that improves the charge retention properties of charge held in the floating gate 154 during operation of the memory cell 110. For example, the stressed layer can reduce the quantum mechanical tunneling of the electrons through the tunnel oxide layer 150. A reduction in such tunneling occurs when the silicon channel layer 128 is strained under an uniaxial tensile stress. Since the retention time of both NAND and NOR memory cells is directly related to the gradual loss of charge via electron tunneling through the tunnel oxide layer 150 and into the channel 128, the retention time of the memory cell can be improved. The polysilicon of both the floating gate 154 and the channel 128 can also be strained to further reduce the leakage current occurring due to tunneling of electrons from the floating gate 154 through the tunnel oxide layer 150. Reducing the tunneling rate not only improves the charge retention time of the floating gate 154, but it also allows higher scalability of the memory cell 110 to have ever-smaller features and thinner tunnel oxide layers 150. It is believed that the electron tunneling rate is reduced by splitting the conduction and valence bands of the silicon and changing the effective mass of electrons. Thus, reducing the tunneling rate improves the charge retention time of the floating gate 154 while also allowing smaller features of the memory cell 110, which combination of properties has been difficult to achieve in prior art memory cell configurations.

The stressed silicon oxide is deposited using processes that result in an intrinsic tensile stress being developed in the layer during the deposition process. For example, stressed silicon oxide can be deposited in the shallow trench layer 136 by a High Aspect Ratio process (HARP), which is a $O_3$/tetraethoxy silane (TEOS) based sub-atmospheric chemical vapor deposition (SACVD) process, as described for example in U.S. patent application Ser. No. 10/846,734 to Arghavani et al, filed on May 14, 2004 and commonly assigned to Applied Materials, which is incorporated by reference herein in its entirety. In an exemplary silicon oxide deposition process, a process gas comprising ozone ($O_3$) and tetraethoxylonesilane (TEOS) is energized to deposit silicon oxide in the trench 136 with the ability to tune the stress of the deposited layer via post deposition annealing processes. One such process uses a process gas comprising $O_3$ in a flow rate of from about 10 slm to about 100 slm and tetraethoxylonesilane (TEOS) in a flow rate of from about 300 mgm to about 10000 mgm. The gas pressure in the chamber is from about 10 to about 600 Torr. The substrate is maintained at a temperature of about 400 to about 600° C.

After the silicon oxide is deposited into the trench 136, excess trench material is removed by, for example, chemical mechanical polishing. As deposited, the silicon oxide comprises a tensile stress, and after annealing at low temperatures, it is transformed to a compressive stressed film, which remains tensile stressed inside the trenches. The tensile stress level of the deposited layer can be also controlled by the process parameters, and can also be changed by treating the deposited layer with ultra-violet or electron radiation, as described below. In one version, the stressed silicon oxide layer preferably comprises a tensile stress of at least about 200 MPa, for even from about 800 MPa to about 1 GPa. This transformation causes more than the initial 200 MPa of tensile stress to be transferred to the floating gate 154 and channel 128.

To deposit silicon nitride which may also be stressed, the process gas comprises a nitrogen-containing gas such as, for example, nitrogen, ammonia, or a combination thereof; and a silicon-containing gas such as, for example, silane, disilane, trimethylsilane (TMS), tetrakis(dimethylamido)silicon (TDMAS), bis(tertiary-butylamine)silane (BTBAS), dichlorosilane (DCS), or a combination thereof. In one version, the energized nitrogen-containing gas is introduced into the chamber at a flow rate of, for example, from about 10 sccm to about 1000 sccm, and the silicon-containing gas is introduced at a flow rate of, for example, from about 10 sccm to about 500 sccm. The pressure of the process gas is maintained to be from about 100 mTorr to about 10 Torr. A stressed silicon nitride layer can be deposited at 400° C. with a tensile stress of about at least 1.2 GPa. It should be noted that the stressed silicon nitride can be deposited both in the trench 136 or around the memory cell as silicon nitride layer 160. Exposure to ultraviolet light can also be used to remove hydrogen from the silicon nitride layer to further increase the tensile stress level of the layer.

The memory cell 110 comprising a stack of layers 142 overlying the silicon substrate to hold or retain charge. The stacked layers 142 include a tunnel oxide layer 150 comprising silicon oxide in a thickness of less than about 100 angstroms, for example, about 70 to about 90 angstroms, and which is formed using conventional oxide forming methods over the substrate. The very thin tunnel oxide layer allows electron tunneling, but this tunneling is substantially reduced by the stressed layers around the memory cell. A floating gate 154 for holding charge during operation of the memory cell is formed on the tunnel oxide layer 150 and is typically composed of polysilicon.

Before or after various deposition and etching processes, the substrate surface can be polished using conventional chemical mechanical polishing methods to smooth its exposed surface. The CMP methods rub a polishing pad against the substrate surface with a polishing slurry therebetween to polish the substrate surface. The polished surface is polished smooth to facilitate the deposition and patterning of overlying layers.

In one method of fabrication, the floating gate 154 is used as a mask to form the two separate and spaced apart $n^+$-doped regions 126a,b which serve as the source 120 and drain 124. Suitable n-type elements include Group VA elements, for example, (P), arsenic (As), or antimony (Sb). Typically, the n-doped regions 126a,b are $n^+$ regions which can be implanted, for example, at an energy level of from about 10 to about 1000 keV and to a dosage of about 1 to $8 \times 10^{15}$ atoms/cm$^2$. An annealing process can be performed to stabilize the ion implanted substrate regions. The source 120 and drain 124 define a channel 128 therebetween, which is simply the p-doped region of the substrate 114 that lies between the source 120 and drain 124. In operation, electrons travel through the channel 128 from the source 120 towards the drain 124 when an electric field is applied across the channel 128. The length of the channel 128, typically measured as the distance between the inside facing edges of the source 120 and drain 124, is typically from about 10 to about 90 nm.

An inter-gate dielectric 156 is formed above the floating gate 154. The inter-gate dielectric 156 can be a silicon oxide layer or a mixture of silicon oxide and silicon nitride. In a preferred embodiment, the inter-gate dielectric 156 comprises a silicon oxide/silicon nitride/silicon oxide layer commonly referred to as an O/N/O structure, which can include, for example, a lower silicon oxide film, middle silicon nitride film, and upper silicon oxide film, which are sequentially layered. A control gate 158 is formed over the inter-gate dielectric 156, the control gate 158 typically composed of polysilicon formed by conventional deposition methods. A silicide layer 168 is formed over the control gate 158 for better electrical contact of an optional overlying contact (not shown).

Optionally, in a silicidation or salicidation process, a metal layer, such as a layer of nickel or cobalt, is deposited over the control gate 158 and heated so that the metal reacts with the underlying silicon material to form the silicide layer 168. The silicide layer 168 can be composed of, for example, nickel silicide, tungsten silicide or cobalt silicide.

Polysilicon layers 166a,b are also formed over the source 120 and drain 124, respectively to improve electrical contact between the regions 120, 124 and an unlanded source contact 170 and drain contact (not shown) both of which typically comprise a conducting metal-containing material.

Additional implantation process can be performed to form regions of higher ion implant levels, commonly known as halos and tips (not shown), which are used to reduce or prevent charge carrier hopping.

The memory cell 110 further comprises a cover layer 162 which has a plurality of layers that can include a nitride spacer 160, oxide layer 164, and pre-metal-deposition (PMD) layer 174, and is formed over the stack of layers 142. It should be noted, without limiting the scope of the present invention, that the nitride spacer 160 and oxide layers 164 can be used as masks to form one or more of the polysilicon layers 166a,b on the substrate 114 and the underlying n-doped regions 126a,b. The pre-metal-deposition layer 174 cover layering the stack of layers and the exposed substrate portions can include, for example, a silicon nitride layer and/or a dielectric layer deposited over the silicon nitride layer. The dielectric layer can be, for example, silicon oxide, phosphosilicate glass, borophosphosilicate glass, borosilicate glass, and phosphosilicate glass, ozone-TEOS derived silicon oxide, among other materials. The contact 170 has an exposed portion 172, which is exposed through the cover layer 162.

In another version, at least one layer of the stack of layers 142 or of the cover layer 162 comprises an overlying stressed layer that induces a tensile strain on the memory cell layers. For example, the overlying stressed layer can be the stressed silicon nitride layer 160. As shown in FIG. 2, such a stressed silicon nitride layer of the spacer 160 would be formed over the floating gate 154 and channel 128 thereby resulting in strain in these layers. The stressed silicon nitride layer 164 can be deposited by a plasma enhanced CVD gas previously described, in which the substrate 114 is exposed to a process gas that includes a silicon-containing gas and a nitrogen-containing gas. The silicon-containing gas can be, for example, silane, disilane, trimethylsilyl (TMS), tris(dimethylamino)silane (TDMAS), bis(tertiary-butylamino)silane (BTBAS), dichlorosilane (DCS), and combinations thereof. The nitrogen-containing gas can be, for example, ammonia, nitrogen, and combinations thereof. In addition, the process gas may contain a diluent gas, which is typically a non-reactive gas, such as nitrogen, helium or argon. The nitrogen can also serve both as a diluent and at least partially as a nitrogen-containing gas. A gas energizer, such as for example, an RF or microwave energizer, to deposit silicon nitride on the substrate, energizes the gas. The process parameters, such as the temperature, gas energizer power level, gas flows and flow ratios and pressure, are selected to provide a stressed silicon nitride having the desired type and magnitude of stress. An exemplary process comprises, for example, a process gas comprising silane in a flow rate of from about 5 to about 100 sccm, and ammonia in a flow rate of from about 10 to about 200 sccm. The process gas can also include nitrogen in a flow rate of from about 5000 to about 30,000 sccm. The process gas may also contain additional gases such as an oxygen-containing gas, for example, oxygen, when depositing silicon oxy-nitride materials. Unless otherwise specified, in these processes, typical gas pressures are from about 3 to about 10 Torr; substrate temperatures are from about 300 to 600° C.; electrode spacing is from about 5 mm (200 mils) to about 12 mm (600 mils); and RF power levels are from about 5 to about 100 Watts. Substrate temperature affected the stress value of the deposited silicon nitride layer. At a temperature of about 400° C., the deposited silicon nitride has a tensile stress value of slightly over 800 MPa; at the higher temperature of about 475° C., a tensile stress value of 1100 MPa was measured; and at a temperature of about 550° C., a tensile stress value of 1200 MPa was measured.

The stressed oxide or nitride layers can also be treated after deposition to modify the stress in the layer, for example by modifying the amount of hydrogen in the stressed layer through UV or electron beam exposure. Examples of methods for depositing silicon nitride and other layers with desired types and magnitudes of stress are described in Provisional Application No. 60/628,600, filed on Nov. 16, 2004, entitled DECOMPOSITION AND TREATMENT OF TENSILE AND COMPRESSIVE STRESSED LAYERS to Balseanu et al., and U.S. application Ser. No. 11/055,936 filed on Feb. 11, 2005 entitled TENSILE AND COMPRESSIVE STRESSES MATERIALS FOR SEMICONDUCTORS to Balseanu et al., both of which are commonly assigned to Applied Materials, and both of which are herein incorporated by reference in their entireties. High temperature, low-pressure thermal CVD processes provide silicon nitride having tensile stresses of at least about 1.7 GPa, for example, plasma-enhanced CVD processes at 400° C., provided a tensile stress of 1.8 GPa.

A suitable single wavelength ultraviolet source comprises an excimer ultraviolet source that provides a single ultraviolet wavelength of 172 nm or 222 nm. A suitable broadband source generates ultraviolet radiation having wavelengths of from about 200 to about 400 nm. Such ultraviolet sources can be obtained from Fusion Company, USA or Nordson Company, USA. The stressed silicon nitride material may be exposed to ultraviolet radiation having other wavelengths that are generated by lamps that contain gas that radiates at specific wavelengths when electrically stimulated. For example, suitable ultraviolet lamp may comprise Xe gas, which generates ultraviolet radiation having a wavelength of 172 nm. In other versions, the lamp may comprise other gases having different corresponding wavelengths, for example, mercury lamps radiate at a wavelength of 243 nm, deuterium radiates at a wavelength of 140 nm, and $KrCl_2$ radiates at a wavelength of 222 nm.

The electron beam exposure conditions depend upon the total dosage applied, the electron beam energy applied to the deposited material, and the electron beam current density. In one version, the electron beam exposure is done in a vacuum of from about $10^{-5}$ to about $10^{-2}$ Torr, and with a substrate temperature in the range of from about 100° C. to about 400° C. The exposure energy may be in the range of from about 0.1 to about 100 keV, and the electron beam current is typically from about 1 to about 100 mA. The electron beam dose falls into the range of from about 1 to about 100,000 $\mu C/cm^2$. The dose and energy selected will be proportional to the thickness of the deposited material to be processed. Generally, the electron beam exposure will be from about 0.5 minute to about 10 minutes. The dosage energy of electrons provided by the electron beam can also be selected to obtain predetermined stress value in the deposited silicon nitride material.

An general embodiment of a substrate processing chamber 200 that can be used for forming various layers of different materials on a substrate 114, such as for example, deposition of nitride, oxide or metal layers for subsequent silicidation, is schematically illustrated in FIG. 3. While an exemplary chamber 200 is used to illustrate the invention, other chambers having different components and structures as would be apparent to one of ordinary skill in the art may also be used, and separate process chambers can be used for separate steps in a semiconductor device fabrication process. For example, one chamber may be provided for forming a stressed silicon oxide layer on the substrate 114, and another chamber for depositing stressed silicon nitride. Accordingly, the scope of the invention should not be limited to the exemplary embodiment of a substrate-processing chamber provided herein.

The substrate-processing chamber 200 illustrated in FIG. 3 is suitable for processing a substrate 114, such as a silicon wafer, using a chemical vapor deposition process to deposit one or more of the stressed layers. The chamber 200 comprises enclosure walls 202 that enclose a process zone 203. In a processing cycle, a substrate 114 is placed on a substrate support 204 by a substrate transport 206 such as, for example, a robot arm, through an inlet port 210. The substrate support 204 can be moved to a lower position for loading and unloading, and can include an enclosed electrode 207. The substrate support 204 can be heated by heater 201, which can be an electrically resistive heating element (as shown), a heating lamp (not shown), or to a plasma itself. The substrate support 204 typically comprises a ceramic structure, which has a receiving surface to see the substrate 114. In use, a DC voltage is applied to the heater 201. The electrode 207 in the substrate support 204 can also be used to electrostatically clamp the substrate 114 to the support 204. The substrate support 204 may also comprise one or more rings (not shown) that at least partially surround a periphery of the substrate 114 on the support 204.

After the substrate loaded support 204 is raised to a processing position that is closer to a gas distributor 208 to provide a desired spacing therebetween. The gas distributor 208 is a showerhead that is located above the process zone 203 for dispersing a process gas therein. The gas distributor 208 can be capable of separately delivering two independent streams of first and second process gas to the process zone 203 without mixing the gas streams prior to their introduction into the process zone, or can premix the process gas before providing the premixed process gas to the process zone 203. First and second gas supplies 224a,b deliver process gases from first and second gas sources 228a,b, via gas conduits 232a,b, and gas valves 244a,b, which control gas flow to the first and second gas inlets 211a,b which feed the process gas to the chamber 200.

The chamber 200 also comprises a gas exhaust 282 to remove spent process gas and byproducts from the chamber 200 and maintain a predetermined pressure of process gas in the process zone 203. In one version, the gas exhaust 282 includes a pumping channel 284 that receives spent process gas from the process zone 203, an exhaust port 285, a throttle valve 286 and one or more exhaust pumps 288 to control the pressure of process gas in the chamber 200. The exhaust pumps 288 may include one or more of a turbomolecular pump, cryogenic pump, roughing pump, or combination-function pumps. The chamber 200 may also comprise an inlet port 272 through a bottom wall 270 of the chamber 200 to deliver a purging gas to the chamber 200. The purging gas typically flows upward from the inlet port 272 past the substrate support 204 to protect surfaces of the support 204 and other chamber components from undesired deposition during the processing.

The chamber 200 also comprises a controller 296 that controls activities and operating parameters of the chamber 200. The controller 296 may comprise, for example, a processor and memory. The processor executes chamber control software, such as a computer program stored in the memory. The memory may be a hard disk drive, read-only memory, flash memory or other types of memory. The controller 296 may also comprise other components, such as a floppy disk drive and a card rack. The card rack may contain a singleboard computer, analog and digital input/output boards, interface boards and stepper motor controller boards. The chamber control software includes sets of instructions that dictate the timing, mixture of gases, chamber pressure, chamber temperature, microwave power levels, high frequency power levels, susceptor position, and other parameters of a particular process. The chamber 200 also comprises a power supply 298 to deliver power to various chamber components such as, for example, the electrode 207, heater 201, or other chamber components. The chamber 200 can also have various sensors, such as a temperature sensing thermocouple (not shown), or an interferometer (also not shown) to detect the temperature of component or substrate surfaces within the chamber 200. The temperature sensor and interferometer is capable of relaying its data to the chamber controller 296 which can then use the temperature data to control the temperature of the processing chamber 200, for example by controlling the resistive heating element 201 in the substrate support 204.

A detailed exemplary process for depositing stressed silicon oxide for shallow trench isolation comprises includes two steps, a gap fill process and a bulk filling process. In the gap fill process, ozone is supplied at a flow rate of 18 slm to 27 slm to form about 12 wt. % to 17 wt. % of the process gas, and TEOS is supplied at 300 mgm to 2700 mgm. The gas pressure in the chamber is set at about 600 Torr. The substrate is maintained at a temperature of about 540° C. at a spacing of about 300 mils between the substrate and showerhead gas distributor. In the bulk filling process, ozone is provided at a flow rate of from about 18 slm to provide about 12.5 wt. % of the process gas, and TEOS provided at a flow rate of 6000 mgm to 9000 mgm. The substrate is maintained at a temperature of about 540° C. at a spacing of about 130 mils to about 170 mils 300 mils between the substrate and showerhead gas distributor. The gas pressure in the chamber is about 600 Torr.

Optionally, in other processes, the process gas can be energized in the chamber in a plasma process by a gas energizer 212 that couples electromagnetic energy, for example, high frequency voltage energy to the process gas to form a plasma from the process gas. To energize the first process gas, the gas energizer 212 comprises a voltage applied between (i) the electrode 207 in the support 204, and (ii) a second electrode 209 which may be the gas distributor 208 or a chamber wall 202. The voltage applied to the electrodes 207, 209 capacitively couples energy to the process gas in the process zone 203. In one version, a voltage is applied to the first electrode 207 at a frequency of from about 350 kHz to about 60 MHz, and a power level of from about 10 to about 1000 Watts, while the second electrode 209 is grounded or floating. The gas energizer 212 can also be an induction coil (not shown). The power supply 298 can be used to applies the desired voltages when a plasma is desired.

While a flash memory cell configuration is described, the present invention can also be used in other configurations. For example, the substrate 114 can also include non-volatile memory cells as a backup memory coupled to RAM cells to make the normally operating volatile cells independent of a backup power supply, the combination of a DRAM and a non-volatile device being called a shadow RAM. For example, U.S. Pat. No. 4,471,471 to DiMaria, which is incorporated herein by reference in its entirety, discloses an array of field effect transistor memory cells each including a DRAM device comprising a floating gate portion and storage node, and a non-volatile memory cell comprising a double electron injector structure adjacent the floating gate portion but remote from the storage node. The floating gate and the electron injector structure are horizontally oriented and remote from the DRAM.

The present invention can also be used with other types of memory devices 100, such as a memory cell 110 comprising a RAM, DRAM or shadow RAM configuration. A memory cell 110 comprising a typical MOS dynamic DRAM configuration comprises a transistor coupled to a capacitor as would be known to one of ordinary skill in the art. The programmed state of the memory cell 110 is a function of the charge stored on the capacitor. The single transistor and capacitor in a DRAM have several advantages with respect to static RAMs; however, the charge on the capacitor in the DRAM leaks can also leak and be lost within a short time. To prevent data from being lost, conventional DRAMs are designed to be refreshed periodically. Thus, DRAMs are referred to as volatile RAMs since the information stored in the DRAM cell is lost when the power supply voltage applied to the memory is lost or turned off. In instances where stored volatile information must be retained, an alternate power supply, such as a battery system, must be coupled to the memory for use in the event of failure of the main power supply.

The present invention has been described with reference to certain preferred versions thereof; however, other versions are possible, for example, other types of stress-inducing materials can also be used as would be apparent to one of ordinary skill. Further, alternative steps of forming the stressed layers can also be used in accordance with the parameters of the described implementation as would be apparent to one of ordinary skill. Therefore, the spirit and scope of the appended claims should not be limited to the description of the preferred versions contained herein.

What is claimed is:

1. A method of fabricating a memory cell on a substrate, the method comprising:
    (a) providing a p-doped substrate;
    (b) forming a pair of spaced apart n-doped regions on the substrate to form a source and s drain and define a channel therebetween;
    (c) forming a stack of layers on the channel, the stack of layers comprising, in sequence, (i) a tunnel oxide layer, (ii) a floating gate, (iii) an inter-gate dielectric, and (iv) a control gate;
    (d) forming a polysilicon layer on the source and the drain;
    (e) forming a cover layer covering the stack of layers, the cover layer comprising a spacer layer and a pre-metal-deposition layer;
    (f) forming a plurality of contacts contacting the source, the drain and a silicide layer, the contacts having exposed portions that are exposed through the cover layer; and
    (g) forming a shallow isolation trench about n-doped regions, the trench comprising a stressed silicon oxide layer having a tensile stress of at least about 200 MPa, whereby the stressed layer induces a tensile strain in the floating gate that reduces leakage of charge held in the floating gate during operation of the memory cell.

2. A method according to claim 1 wherein (g) comprises forming stressed silicon oxide layer using TEOS.

3. A method according to claim 1 comprising forming a spacer layer comprising stressed silicon nitride having a tensile stress of at least about 1.5 GPa.

4. A method according to claim 1 comprising fabricating a flash memory configuration.

5. A method according to claim 1 comprising fabricating a RAM configuration.

6. A method according to claim 1 comprising fabricating a DRAM configuration.

* * * * *